(12) United States Patent
Hsieh et al.

(10) Patent No.: US 11,754,444 B2
(45) Date of Patent: Sep. 12, 2023

(54) DISTRIBUTED INTEGRATE AND DUMP CIRCUIT

(71) Applicant: Rockwell Collins, Inc., Cedar Rapids, IA (US)

(72) Inventors: Han Chi Hsieh, Gaithersburg, MD (US); Wenlu Chen, Clarksville, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/207,599

(22) Filed: Mar. 19, 2021

(65) Prior Publication Data

US 2022/0299363 A1 Sep. 22, 2022

(51) Int. Cl.
*G01J 1/46* (2006.01)
*H03F 3/08* (2006.01)
*G01J 1/42* (2006.01)

(52) U.S. Cl.
CPC .......... *G01J 1/46* (2013.01); *H03F 3/08* (2013.01); *G01J 2001/4238* (2013.01)

(58) Field of Classification Search
CPC ........ G01J 1/46; G01J 2001/4238; H03F 3/08
See application file for complete search history.

(56) References Cited

U.S. PATENT DOCUMENTS

| | | | |
|---|---|---|---|
| 4,789,840 A | 12/1988 | Albin | |
| 5,812,038 A | 9/1998 | Gu et al. | |
| 6,411,494 B1 | 6/2002 | Watt | |
| 8,890,051 B2 * | 11/2014 | Funakoshi | H03F 3/005 250/214 R |
| 9,305,629 B2 | 4/2016 | Manipatruni et al. | |
| 9,746,372 B2 * | 8/2017 | Veryeras | G01S 17/08 |
| 9,960,781 B1 | 5/2018 | Chen et al. | |
| 10,075,154 B1 | 9/2018 | Hsieh | |
| 2002/0164107 A1 * | 11/2002 | Boudreau | G02B 6/4257 385/14 |
| 2002/0179573 A1 | 12/2002 | Gianchandani et al. | |

(Continued)

FOREIGN PATENT DOCUMENTS

GB 2548053 B 11/2017

OTHER PUBLICATIONS

Xu, Hao, "Mixed-Signal Circuit Design Driven by Analysis: ADCs, Comparators, and PLLs", University of California, Los Angeles, Dissertation, 2018, 205 pages.

*Primary Examiner* — Seung C Sohn
(74) *Attorney, Agent, or Firm* — Suiter Swantz pc llo

(57) ABSTRACT

An analog pulse capture circuit is disclosed. The circuit may include one or more input sources configured to receive one or more optical signals and generate one or more electrical input signals. The circuit may include one or more distributed capacitors configured to store a target charge, the one or more distributed capacitors including one or more top plates and one or more bottom plates. The circuit may include one or more amplifiers coupled to the one or more distributed capacitors, the one or more amplifiers configured to generate one or more electrical output signals. The circuit may include one or more dump switches coupled to the one or more input sources, the one or more dump switches configured to release the stored target charge of the one or more distributed capacitors.

9 Claims, 9 Drawing Sheets

(56) References Cited

U.S. PATENT DOCUMENTS

| | | | |
|---|---|---|---|
| 2003/0042406 A1* | 3/2003 | Charbon | H04N 5/379 348/E3.021 |
| 2010/0019300 A1 | 1/2010 | Yu et al. | |
| 2010/0108862 A1* | 5/2010 | Mizoguchi | H04N 5/3575 250/214 A |
| 2014/0184435 A1* | 7/2014 | Wang | H03M 1/1245 341/161 |
| 2020/0386079 A1 | 12/2020 | Vehra | |

\* cited by examiner

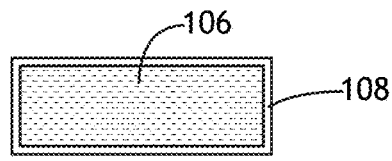
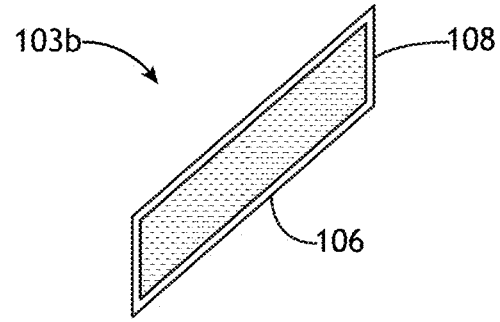
FIG.3A  FIG.3B
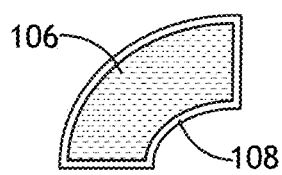
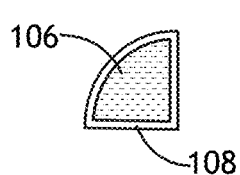
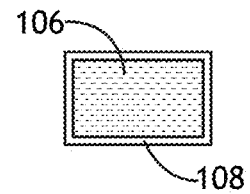
FIG.3C  FIG.3D  FIG.3E

DISTRIBUTED INTEGRATE AND DUMP CIRCUIT

BACKGROUND

In optical electronics, photo-detected optical pulse energy is converted to a voltage signal through conversion circuits for processing and integrate-and-dump circuit is one such circuit to convert optical pulse energy for processing. One critical element affecting performance in the integrate-and-dump circuits is the integrating capacitor. The integrating capacitor is configured to store input signal during the integrate phase and discharge the stored signal during the dump phase. The integrating capacitor can have profound impacts on the performance of targeted applications including fiber optical communications, free space optical communications, radio frequency (RF) analog links, remote sensing, material science, or the like.

SUMMARY

An analog pulse capture circuit is disclosed, in accordance with one or more embodiments of the disclosure. In one embodiment, the circuit includes one or more input sources configured to receive one or more optical signals and generate one or more electrical input signals. In another embodiment, the circuit includes one or more distributed capacitors configured to store a target charge, the one or more distributed capacitors including one or more top plates and one or more bottom plates. In another embodiment, the circuit includes one or more amplifiers coupled to the one or more distributed capacitors, the one or more amplifiers including at least one inverting terminal and at least one non-inverting terminal; the one or more amplifiers configured to generate one or more electrical output signals. In another embodiment, the circuit includes one or more dump switches coupled to the one or more input sources, the one or more dump switches configured to release the stored target charge of the one or more distributed capacitors.

In some embodiments, the one or more distributed capacitors may include a first set of one or more distributed capacitors and an additional set of one or more distributed capacitors.

In some embodiments, the one or more amplifiers may include one or more differential amplifiers coupled to the first set of one or more distributed capacitors and the additional set of one or more distributed capacitors.

In some embodiments, the one or more top plates of the first set of one or more distributed capacitors may be coupled to the at least one inverting terminal of the one or more differential amplifiers and the one or more top plates of the additional set of one or more distributed capacitors are coupled to the at least one non-inverting terminal of the one or more differential amplifiers.

In some embodiments, the one or more input sources may include one or more photodiodes.

In some embodiments, the one or more distributed capacitors may include one or more interconnects.

In some embodiments, the one or more interconnects may include a plurality of interconnects to form one or more modular distributed capacitors.

In some embodiments, the one or more distributed capacitors may include one or more coplanar waveguides.

In some embodiments, the one or more top plates may be coupled to the at least one inverting terminal.

An interleaving analog pulse capture circuit is disclosed, in accordance with one or more embodiments of the disclosure. In one embodiment, the circuit includes one or more input sources configured to receive one or more optical signals and generate one or more electrical input signals. In another embodiment, the circuit includes one or more sets of one or more distributed capacitors configured to store a target charge, each of the one or more distributed capacitors including one or more top plates and one or more bottom plates. In another embodiment, the circuit includes a plurality of amplifiers, each amplifier of the plurality of amplifiers coupled to the one or more distributed capacitors of the one or more sets of one or more distributed capacitors, each amplifier including at least one inverting terminal and at least one non-inverting terminal, each amplifier of the plurality of amplifiers configured to generate one or more electrical output signals. In another embodiment, the circuit includes a plurality of dump switches coupled to the one or more input sources, the one or more switches configured to release the stored target charge of the one or more distributed capacitors. In another embodiment, the circuit include a plurality of interleaving switches.

In some embodiments, the one or more input sources may include one or more photodiodes.

In some embodiments, the one or more distributed capacitors may include one or more interconnects.

In some embodiments, the one or more interconnects may include a plurality of interconnects to form one or more modular distributed capacitors.

In some embodiments, the one or more distributed capacitors may include one or more coplanar waveguides.

In some embodiments, the one or more top plates may be coupled to the at least one inverting terminal.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the disclosure are disclosed in the following detailed description and the accompanying drawings. The drawings are not necessarily to scale. In general, operations of disclosed processes may be performed in an arbitrary order, unless otherwise provided in the claims. In the drawings:

FIG. 3A illustrates a top view of an example interconnect of a modular distributed capacitor of the analog pulse capture circuit, in accordance with one or more embodiments of the disclosure.

FIG. 3B illustrates a top view of an example interconnect of a modular distributed capacitor of the analog pulse capture circuit, in accordance with one or more embodiments of the disclosure.

FIG. 3C illustrates a top view of an example interconnect of a modular distributed capacitor of the analog pulse capture circuit, in accordance with one or more embodiments of the disclosure.

FIG. 3D illustrates a top view of an example interconnect of a modular distributed capacitor of the analog pulse capture circuit, in accordance with one or more embodiments of the disclosure.

FIG. 3E illustrates a top view of an example interconnect of a modular distributed capacitor of the analog pulse capture circuit, in accordance with one or more embodiments of the disclosure.

DETAILED DESCRIPTION OF THE INVENTION

Figure 1A:
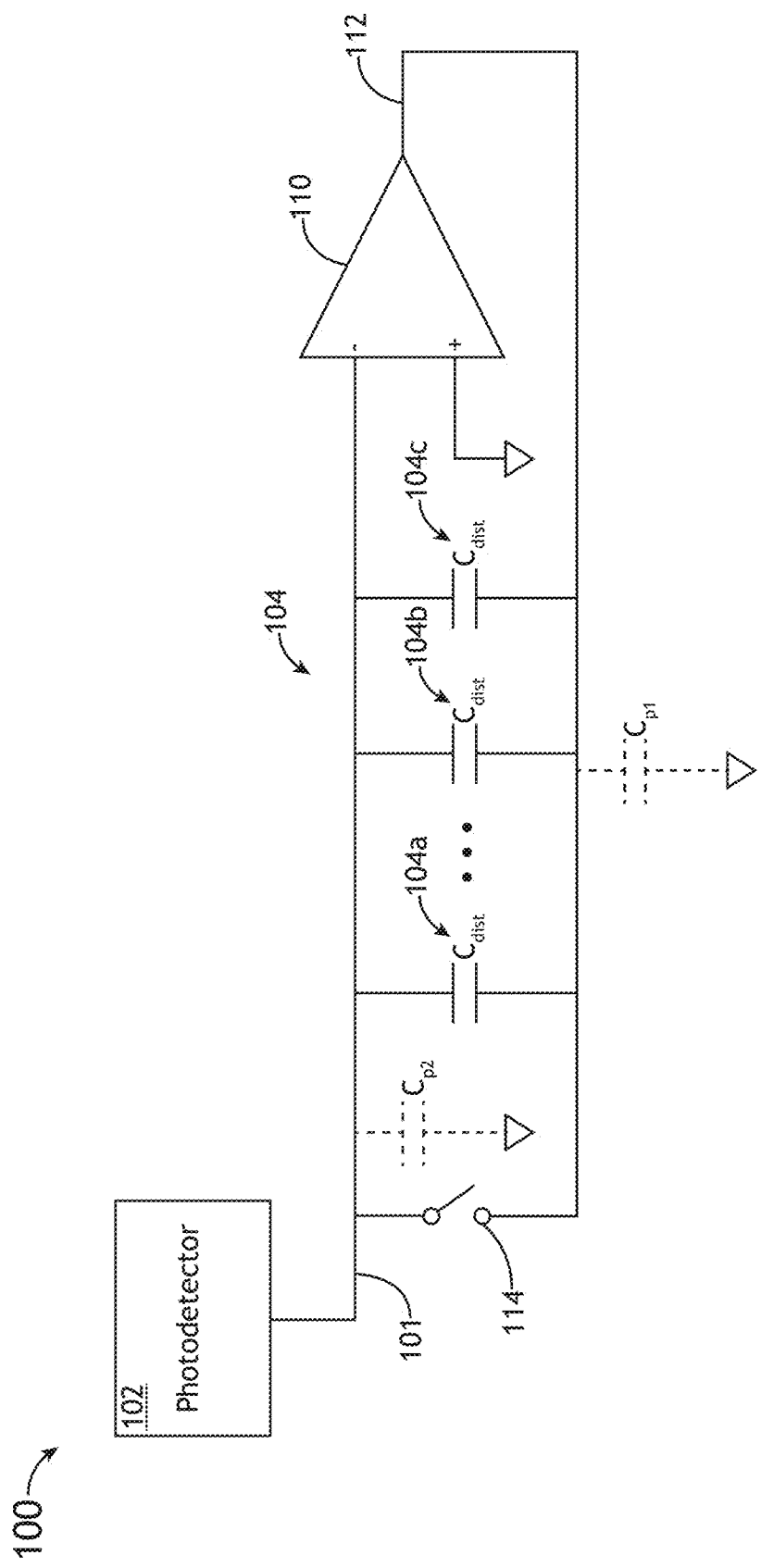
FIG. 1A illustrates a simplified schematic view of an analog pulse capture circuit, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

In analog pulse capture circuits, the photodetector generates a current pulse train and these current pulses are converted to voltage before applying analog signal processing techniques. One way to convert these photodiode pulses into voltage is to use an integrate-and-dump circuit (InD circuit) that uses an integrating capacitor ($C_{INT}$) to integrate each current pulse into voltage. However, in these InD circuits, the integrating capacitor ($C_{INT}$) needs to be reset to zero (e.g., dumping the charge in the capacitor using the dump switch) before integrating the next current pulse.

Further, in these InD circuits, the size of the capacitor directly limits the signal-to-noise ratio (SNR) of the InD circuit. In voltage-mode based designs (e.g., digitizing an input signal in the voltage domain), smaller capacitors have higher thermal noise and hence a worse signal-to-noise ratio (SNR). In contrast, in current-mode based designs (e.g., digitizing an input signal in the current domain), smaller capacitors have higher converted voltage signals than thermal noise and hence better SNR.

The SNR degradation is further compounded by the parasitic capacitance of the interconnect. Parasitic capacitance ($C_p$) of the interconnect exists between the photodiode and the input signal. The parallel parasitic capacitance ($C_p$) is added to the integrating capacitance ($C_{INT}$) to form the total integrating capacitor ($C_{Total}$), which is shown and described below:

$$C_{Total} = C_{INT} + C_p$$

Parasitic capacitance ($C_p$) is an undesired artifact. As such, it is important that the parasitic capacitance ($C_p$) is managed so that it does not become dominant when reducing the integrating capacitor ($C_{INT}$).

Broadly, embodiments of the present disclosure are directed to an analog pulse capture circuit including one or more distributed capacitors to eliminate the need of one compact integrating capacitors, which in turn greatly improves the signal-to-noise ratio (SNR).

Figure 1B:
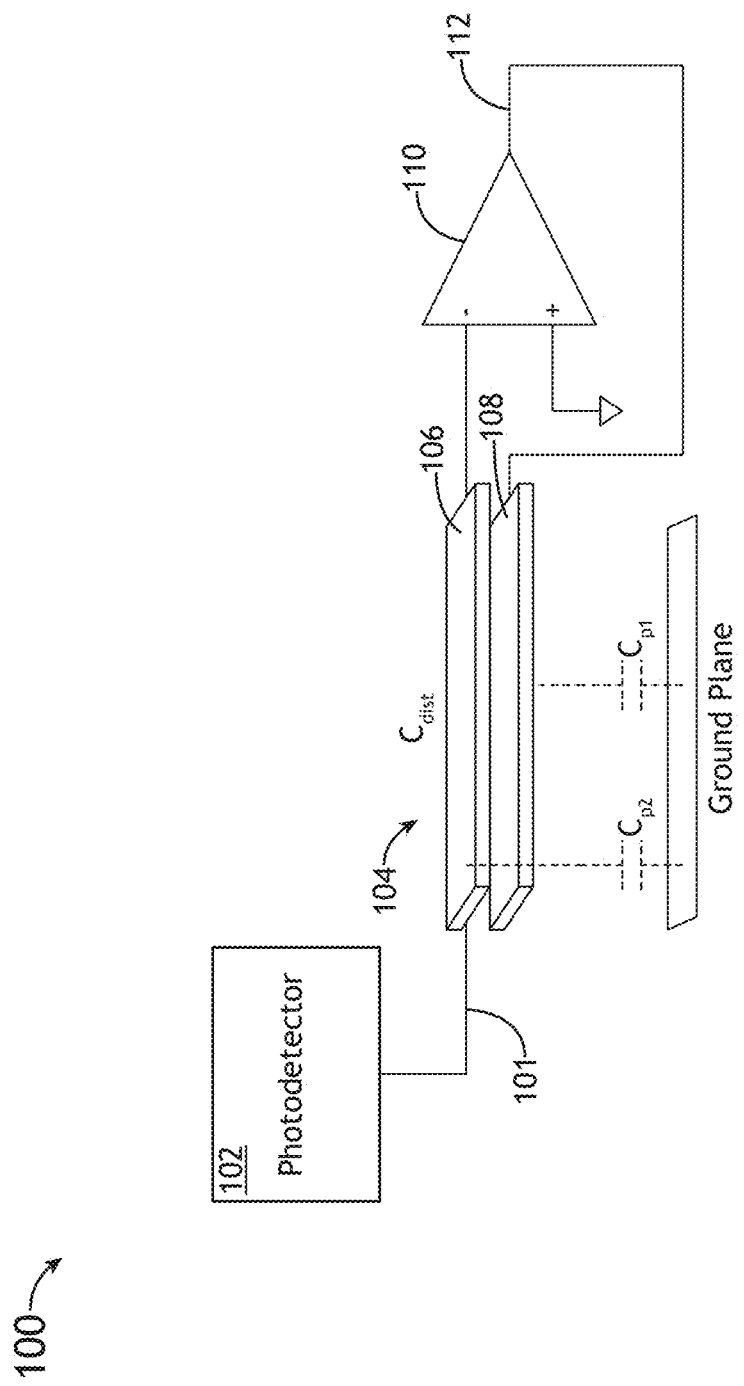
FIG. 1B illustrates a conceptual view of the analog pulse capture circuit, in accordance with one or more embodiments of the disclosure.

FIG. 1A illustrates a simplified schematic view of the analog pulse capture circuit 100, in accordance with one or more embodiments of the disclosure. FIG. 1B illustrates a conceptual view of the analog pulse capture circuit 100, in accordance with one or more embodiments of the disclosure.

The analog pulse capture circuit 100 may include a photodetector 102 configured to receive one or more optical signals and convert the one or more received optical signals into one or more electrical signals 101. For example, the photodetector 102 may be configured receive one or more pulsed optical signals and generate current pulses signals for processing. The photodetector 102 may include any device suitable for converting optical signals into electrical signals such as, but not limited to, a photodiode.

The analog pulse capture circuit 100 may further include one or more distributed capacitors 104 configured to store a target charge. Although FIG. 1A illustrates a specific number of distributed capacitors, it is noted that the analog pulse capture circuit 100 may include any number of distributed capacitors 104. For example, in some embodiments, the analog pulse capture circuit 100 may include a plurality of distributed capacitors 104. For instance, as shown in FIG. 1A, the analog pulse capture circuit 100 may include a first distributed capacitor 104a, a second distributed capacitor 104b, a third distributed capacitor 104c, up to an N number of capacitors. By way of another example, in some embodiments, as shown in FIG. 1B, the analog pulse capture circuit 100 may include a distributed capacitor 104.

As shown in FIG. 1B, the one or more distributed capacitors 104 may include a top plate 106 and a bottom plate 108. For example, the distributed capacitors 104 may include a top plate 106 positioned a select distance above a portion of a bottom plate 108. The distance between the top plate 106 and the bottom plate 108 may determine the distributed capacitor's capacitance value. It is noted that the distance between the top plate 106 and the bottom plate 108 may include any distance of separation suitable for the analog pulse capture circuit 100.

The one or more distributed capacitors 104 may produce parasitic capacitance $C_p$. For example, the top plate 106 may form parasitic capacitance $C_{p1}$ to ground plane and the bottom plate 108 may form a parasitic capacitance $C_{p2}$ to ground plane.

The one or more distributed capacitors 104 may be referenced to a ground plane. For example, the top plate 106 of the one or more distributed capacitors 104 may be referenced to the ground plane. By way of another example, the bottom plate 108 of the one or more distributed capacitors 104 may be referenced to the ground plane.

Figure 2A:
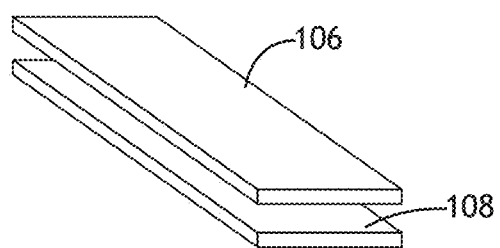
FIG. 2A illustrates a conceptual view of an example distributed capacitor of the analog pulse capture circuit, in accordance with one or more embodiments of the disclosure.
Figure 2B:
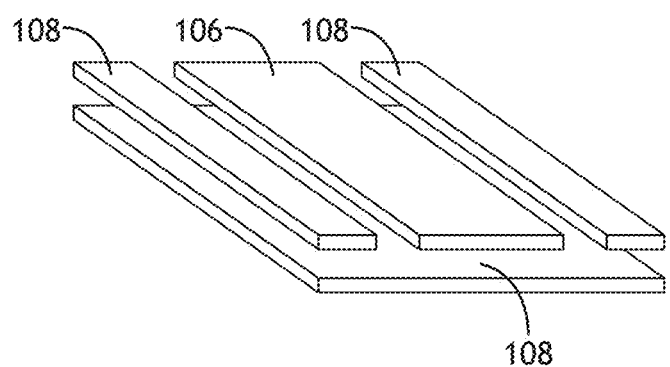
FIG. 2B illustrates a conceptual view of an example distributed capacitor of the analog pulse capture circuit, in accordance with one or more embodiments of the disclosure.

FIGS. 2A-2B illustrate conceptual views of example distributed capacitors 104, in accordance with one or more embodiments of the present disclosure.

In some embodiments, as shown in FIG. 2A, the one or more distributed capacitors 104 may include a basic distributed capacitor (e.g., a single interconnect 103a-103e) including a top plate 106 and a bottom plate 108.

In some embodiments, as shown in FIG. 2B, the one or more distributed capacitors 104 may include one or more coplanar waveguides. The one or more coplanar waveguides may include a top plate 106 and one or more bottom plates 108. For example, as shown in FIG. 2B, the one or more coplanar waveguides may include a right bottom plate positioned to the right of the top plate 106, a left bottom plate positioned to the left of the top plate 106, and a lower bottom plate positioned below the top plate 106.

Figure 4A:
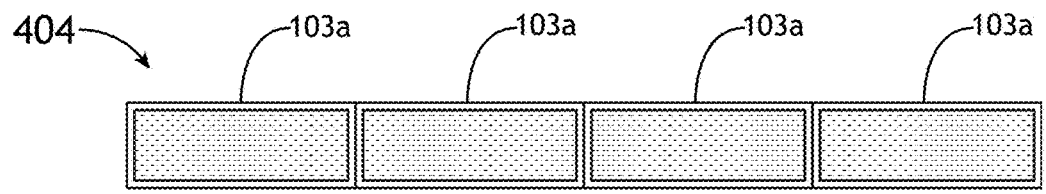
FIG. 4A illustrates a top view of an example modular distributed capacitor of the analog pulse capture circuit, in accordance with one or more embodiments of the disclosure.
Figure 4B:
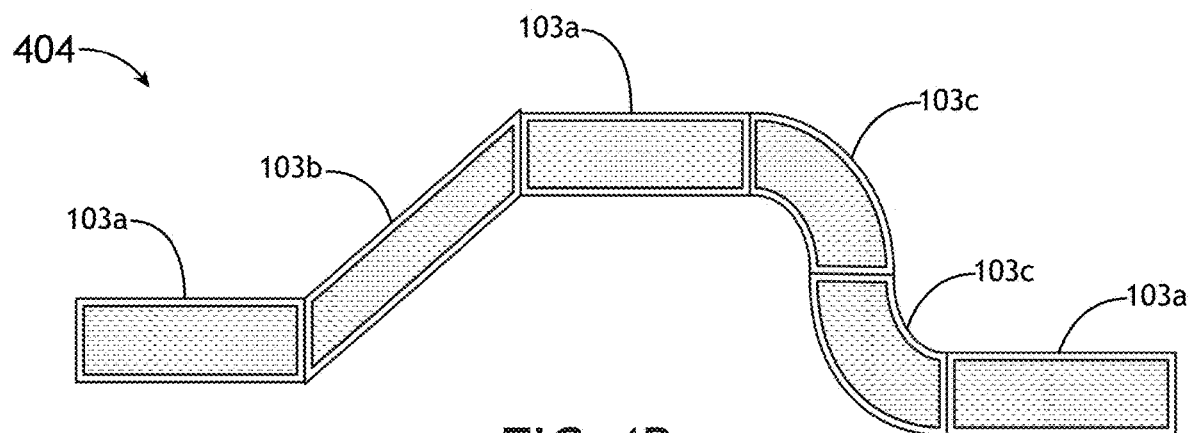
FIG. 4B illustrates a top view of an example modular distributed capacitor of the analog pulse capture circuit, in accordance with one or more embodiments of the disclosure.
Figure 4C:
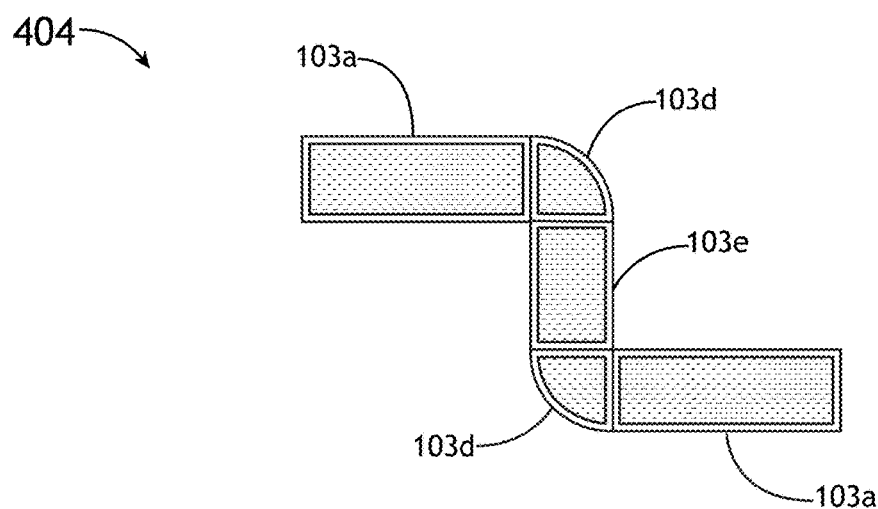
FIG. 4C illustrates a top view of an example modular distributed capacitor of the analog pulse capture circuit, in accordance with one or more embodiments of the disclosure.

FIGS. 3A-3E illustrate top views of various example interconnects 103a-103e of a modular distributed capacitor 404, in accordance with one or more embodiments of the present disclosure. FIGS. 4A-4C illustrate top views of various example modular distributed capacitors 404, in accordance with one or more embodiments of the present disclosure. It is noted that the one or more modular distributed capacitors 404 may be any shape or size. FIGS. 3A-4C are provided merely for illustrative purposes and shall not be construed as limiting the scope of the present disclosure.

In some embodiments, as shown in FIG. 4A-4C, the one or more distributed capacitors 104 may include one or more modular distributed capacitors 404. For example, the one or more modular distributed capacitors 404 may include one or more interconnects 103a-103e. For example, as shown in FIGS. 4A-4C, the one or more distributed capacitors 404 may include a plurality of interconnects 103a-103e configured to form a modular distributed capacitor. The interconnects 103a-103e may be any length, height, and/or shape suitable for the analog pulse capture circuit 100. For example, as shown in FIGS. 3A and 3E, the one or more interconnects may be a rectangle 103a or rectangle 103e. By way of another example, as shown in FIG. 3B, the one or more interconnects may be a diagonal strip 103b. By way of another example, as shown in FIG. 3C, the one or more interconnects may be an arc 103c. By way of another example, as shown in FIG. 3D, the one or more interconnects may be a quarter circle 103d.

The one or more modular distributed capacitors 404 may be formed using either the basic construction (as shown in FIG. 2A) or the coplanar waveguide construction (as shown in FIG. 2B).

It is noted that the one or more distributed capacitors 104, 404 may be fabricated using any material and using any technique. For example, the one or more distributed capacitors 104 may be formed using, but not required to be formed using, copper, aluminum, or the like.

Referring back to FIGS. 1A-1B, the analog pulse capture circuit 100 may further include an amplifier 110 including a non-inverting (+) terminal and an inverting (−) terminal. The amplifier 110 may be configured to generate one or more electrical output signals 112 based on a voltage comparison. For example, the amplifier 110 may be configured to compare a first voltage level to another additional voltage level (or a reference voltage level) and generate one or more electrical output signals 112 based on this voltage comparison. For instance, the amplifier 110 may be configured to compare the magnitude of a plurality of voltage inputs and generate an electrical voltage output with negated magnitude equal to the voltage input difference.

The amplifier 110 may couple to a portion of the one or more distributed capacitors 104 via at least one of the non-inverting terminal or the inverting terminal. For example, the top plate 106 of the one or more distributed capacitors 104 may be configured to couple to the inverting terminal, such that the voltage level from the top plate 106 may be compared to a reference voltage level of the non-inverting terminal. In this regard, the amplifier 110 may be configured to compare the magnitude of the non-inverting terminal and the inverting terminal and generate an electrical voltage output with negated magnitude equal to the voltage terminal difference.

It is noted that the circuit 100 may include any type of amplifier 110 including, but not limited to, an operational amplifier (op-amp), or the like.

The analog pulse capture circuit 100 may further include a dump switch 114 (reset switch 114) connecting the amplifier 110 and the input source 102 (e.g., the photodetector 102). The dump switch 114 may be configured to dump the charge stored in the distributed capacitor 104. It is noted that the switch 114 is not shown in FIG. 2 for purposes of simplicity.

Figure 5A:
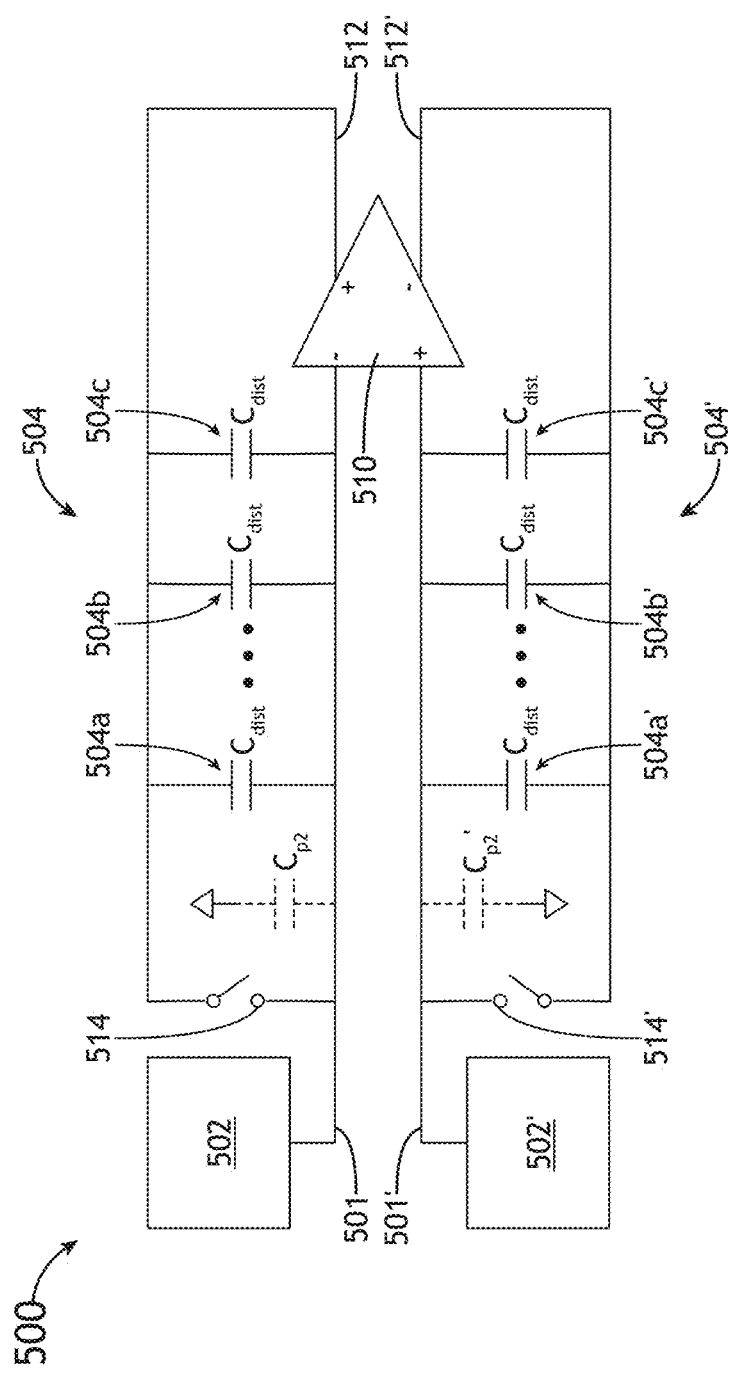
FIG. 5A illustrates a simplified schematic view of a differential analog pulse capture circuit, in accordance with one or more embodiments of the disclosure.
Figure 5B:
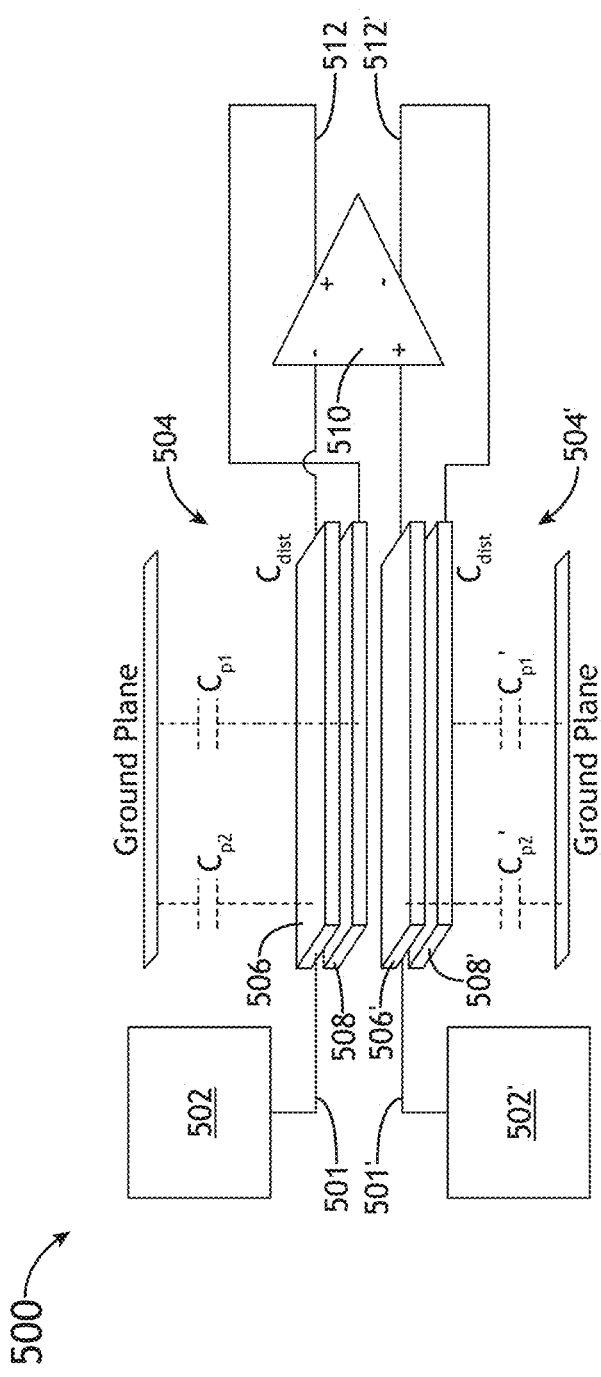
FIG. 5B illustrates a simplified implementation view of the differential analog pulse capture circuit, in accordance with one or more embodiments of the disclosure.

FIG. 5A illustrates a simplified schematic view of a differential analog pulse capture circuit 500, in accordance with one or more embodiments of the present disclosure. FIG. 5B illustrates an implementation view of the differential analog pulse capture circuit 500, in accordance with one or more embodiments of the present disclosure. It is noted that the description of the various embodiments, components, and operations described previously herein with respect to the analog pulse capture circuit 100 should be interpreted to extend to the analog pulse capture circuit 500. It is noted that the differential analog pulse capture circuit 500 may have a number of advantages including, but not limited to, common-mode noise cancellation, the dynamic range is doubled, and the second-order harmonics are reduced.

The differential analog pulse capture circuit 500 may include a plurality of photodetectors, where each photodetector is configured to receive one or more optical signals and convert the one or more received optical signals into one or more electrical signals. Each photodetector may be configured receive one or more optical signals and generate a stream of current mode signals for processing. For example, the differential analog pulse capture circuit 500 may include a first photodetector 502 configured to generate a first input signal 501. By way of another example, the differential analog pulse capture circuit 500 may include an additional photodetector 502' configured to generate an additional input signal 501'.

The plurality of photodetectors may include any device suitable for converting optical signals into electrical signals such as, but not limited to, one or more photodiodes.

The differential analog pulse capture circuit 500 may include a plurality of distributed capacitors. For example, the differential analog pulse capture circuit 500 may include a first set of one or more distributed capacitors 504 and an additional set of one or more distributed capacitors 504'. In one instance, as shown in FIG. 5A, the first set of one or more distributed capacitors 504 may include a first distributed capacitor 504a, a second distributed capacitor 504b, a third distributed capacitor 504c, and up to an N number of distributed capacitors. In another instance, as shown in FIG. 5A, the additional set of one or more distributed capacitors 504' may include a first distributed capacitor 504a', a second distributed capacitor 504b', a third distributed capacitor 504c', and up to an N number of distributed capacitors.

Each distributed capacitor of the plurality of distributed capacitors may include a top plate and a bottom plate. For example, the first set of one or more distributed capacitors 504 may include a top plate 506 and a bottom plate 508. By way of another example, the additional set of one or more distributed capacitors 504' may include a top plate 506' and a bottom plate 508'.

The plurality of distributed capacitors may produce parasitic capacitance $C_p$. For example, the first set of one or more distributed capacitors 404 may produce a parasitic capacitance. For instance, the top plate 506 of the first set of distributed capacitors 404 may produce a parasitic capacitance $C_{p1}$ and the bottom plate 508 of the first set of distributed capacitors 504 may produce a parasitic capacitance $C_{p2}$. By way of another example, the additional set of one or more distributed capacitors 504' may produce a parasitic capacitance. For instance, the top plate 506' of the additional set of distributed capacitors 504' may produce a parasitic capacitance $C_{p1'}$ and the bottom plate 508' of the additional set of distributed capacitors 504' may produce a parasitic capacitance $C_{p2'}$. It is noted that each parasitic capacitance formed (e.g., $C_{p1}$, $C_{p2}$, $C_{p1'}$, $C_{p2'}$) may be summed together to calculate the total parasitic capacitance, which helps to simplify the calculation process.

The plurality of distributed capacitors may be referenced to a ground plane. For example, the first set of distributed capacitors 504 may be referenced to a ground plane. For instance, the top plate 506 of the first set of distributed capacitors 504 may be referenced to a ground plane and the bottom plate 508 of the first set of distributed capacitors 504 may be referenced to a ground plane. By way of another example, the additional set of distributed capacitors 504' may be referenced to a ground plane. For instance, the top plate 506' of the additional set of distributed capacitors 504' may be referenced to a ground plane and the bottom plate 508' of the additional set of distributed capacitors 504' may be referenced to a ground plane.

The differential analog pulse capture circuit 500 may include a differential amplifier 510 including a plurality of inverting (+) terminals and a plurality of non-inverting (−) terminals, such that the differential amplifier 510 is configured to amplify the voltage difference present on the inverting and non-inverting inputs. For example, the differential amplifier 510 may include an input inverting terminal and an input non-inverting terminal. By way of another example, the differential amplifier 510 may include an output inverting terminal configured to generate a first output 512 and an output non-inverting terminal configured to generate an additional output 512'.

The differential amplifier 510 may be configured to couple to a portion of the plurality of distributed capacitors. For example, the first set of one or more distributed capacitors 504 may be configured to couple to the input non-inverting terminal and the output inverting terminal. For instance, the top plate 506 may be configured to couple to the input non-inverting terminal and the bottom plate 508 may be configured to couple to the output inverting terminal. By way of another example, the additional set of one or more distributed capacitors 504' may be configured to couple to the input inverting terminal and the output non-inverting terminal. For instance, the top plate 506' may be configured to couple to the input inverting terminal and the bottom plate 508' may be configured to couple to the output non-inverting terminal.

The differential analog pulse capture circuit 500 may include a plurality of dump switches configured to dump the charge stored in the one or more distributed capacitors 504, 504'. For example, the differential analog pulse capture circuit 500 may include a first switch 514 configured to connect the input source 502 to the differential amplifier 510. For example, the differential analog pulse capture circuit 500 may include an additional switch 514' configured to connect the input source 502' to the differential amplifier 510. It is noted that the plurality of switches are not shown in FIG. 5B for purposes of simplicity.

Figure 6:
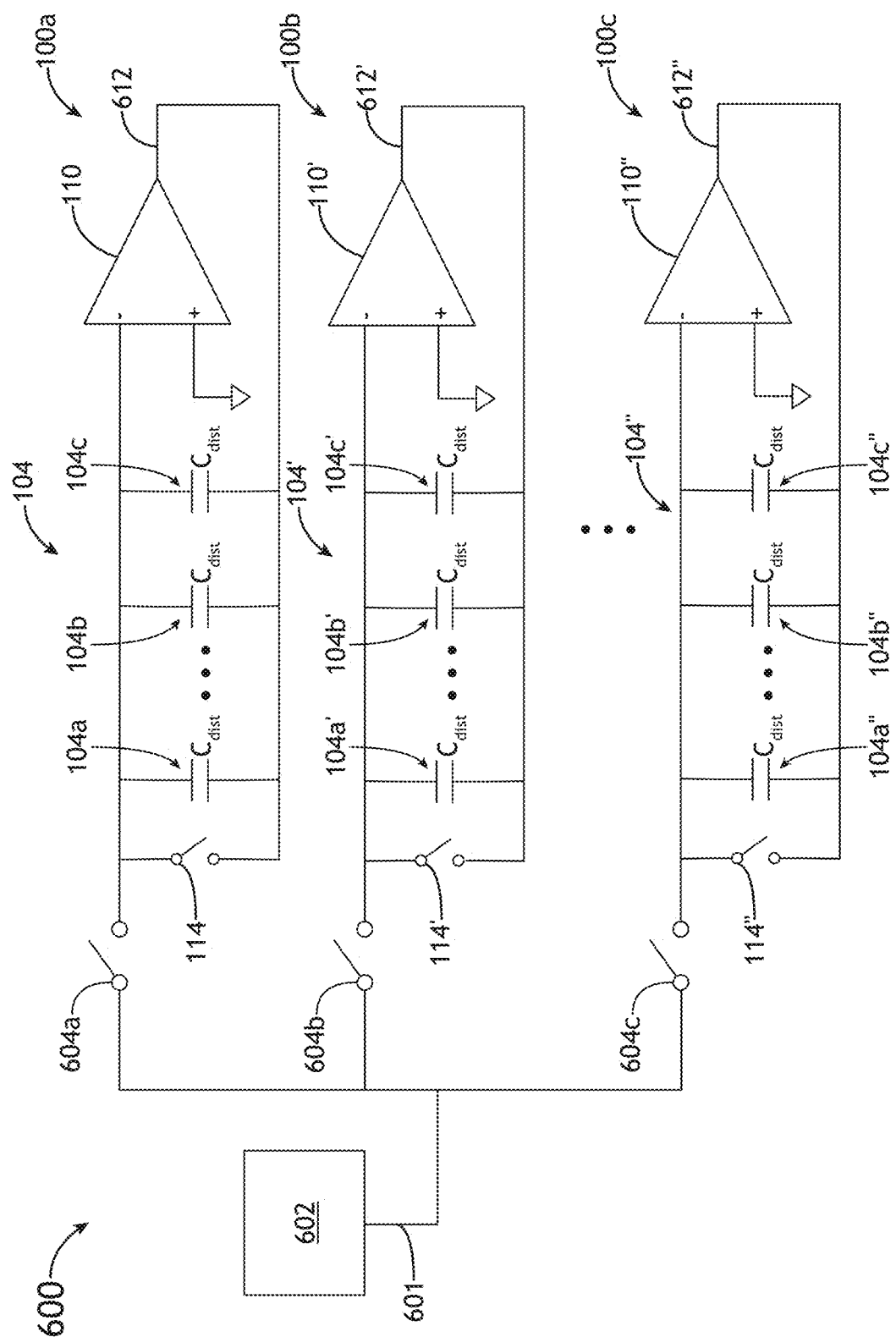
FIG. 6 illustrates a simplified schematic view of an interleaved analog pulse capture circuit, in accordance with one or more embodiments of the present disclosure.

FIG. 6 illustrates a simplified schematic view of an interleaved analog pulse capture circuit 600, in accordance with one or more embodiments of the present disclosure. It is noted that the description of the various embodiments, components, and operations described previously herein with respect to the analog pulse capture circuit 100 should be interpreted to extend to the analog pulse capture circuit 600.

It is noted that in some applications, there is a need to interleave integrate-and-dump in order to take full bandwidth of the input source (e.g., photodiode) by reducing sampling clock speed on each individual channel. In conventional interleaved circuits, as the number of interleaved circuits increases, the total capacitance ($C_{Total}$) increases due to a larger parasitic capacitance ($C_p$) caused by the longer distance. For example, in a complex circuit, the parasitic capacitance may approach or exceed the integrating capacitance. It is noted herein that the interleaved integrate-and-dump 600 of the present disclosure may be configured to relax clock distribution network.

The interleaved analog pulse capture circuit 600 may include a photodetector 602 configured to receive one or more optical signals and convert the one or more received optical signals into one or more electrical signals 601. For example, the photodetector 602 may be configured receive one or more optical signals and generate a stream of current mode signals for processing. The photodetector 602 may include any device suitable for converting optical signals into electrical signals 601 such as, but not limited to, a photodiode.

The interleaved analog pulse capture circuit 600 may include a plurality of analog pulse capture circuits (such as the analog pulse capture circuit 100 shown in FIGS. 1A-1B). For example, the interleaved analog pulse capture circuit 600 may include a first analog pulse capture circuit 100a configured to generate a first output 612, a second analog pulse capture circuit 100b configured to generate a second output 612', a third analog pulse capture circuit 100c configured to generate a third output 612", and up to an N number of analog pulse capture circuits configured to generate up to an N number of outputs.

Each circuit may include, but are not limited to, one or more distributed circuits, one or more amplifiers, and one or more switches. For example, the first analog pulse capture circuit 100a may include a first set of one or more distributed capacitors 104, a first amplifier 110, and a first dump switch 114. By way of another example, the second analog pulse capture circuit 100b may include a second set of one or more distributed capacitors 104', a second amplifier 110', and a second dump switch 114'. By way of another example, the third analog pulse capture circuit 100c may include a third set of one or more distributed capacitors 104", a third amplifier 110", and a third dump switch 114". In this embodiment, a first pulse may be sent to the amplifier 110, the second pulse may be sent to the amplifier 110', and the Nth pulse may be sent to the amplifier 110". The Nth+1 pulse may then be sent to the amplifier 110 again and process may be repeated. It is noted that each time the process repeats the pulses are coming at a faster rate and each amplifier 110 is capturing at a slower rate.

Each set of one or more distributed capacitors may include one or more distributed capacitors. For example, the first set of one or more distributed capacitors 104 may include a first distributed capacitor 104a, a second distributed capacitor 104b, a third distributed capacitor 104c, and up to an N number of distributed capacitors. By way of another example, the second set of one or more distributed capacitors 104' may include a first distributed capacitor 104a', a second distributed capacitor 104b', a third distributed capacitor 104c', and up to an N number of distributed capacitors. By way of another example, the third set of one or more distributed capacitors 104" may include a first distributed capacitor 104a", a second distributed capacitor 104b", a third distributed capacitor 104c", and up to an N number of distributed capacitors. Although FIG. 6 illustrates a specific number of distributed capacitors, it is noted herein that the analog pulse capture circuit 600 may include any number of distributed capacitors. It is noted that FIG. 6 is provided merely for illustrative purposes and shall not be construed as limiting the scope of the present disclosure.

Although FIG. 6 illustrates a specific number of circuits 100a-100c, it is noted herein that the interleaved circuit 600 may include any number of analog pulse capture circuits 100. It is noted that FIG. 6 is provided merely for illustrative purposes and shall not be construed as limiting the scope of the present disclosure.

The interleaved analog pulse capture circuit 600 may include one or more interleaving switches (or demultiplexing switches) configured to connect the photodetector 602 to each of the one or more analog pulse capture circuits 100a-100c. For example, the analog pulse capture circuit 600 may include a first interleaving switch 604a, a second interleaving switch 604b, a third interleaving switch 604c, and up to an N number of interleaving switches. In one instance, the first interleaving switch 604a may be configured to connect the photodetector 602 to the first circuit 100a. In another instance, the second interleaving switch 604b may be configured to connect the photodetector 602 to the second circuit 100b. In another instance, the third interleaving switch 604c may be configured to connect the photodetector 602 to the third circuit 100c.

The one or more interleaving switches 604-604" and the one or more dump switches 114-114" may co-locate in close proximity to the input 602. In this regard, the clock distribution network that distributes clocks with the sample phase to the switches may be related.

Figure 7:
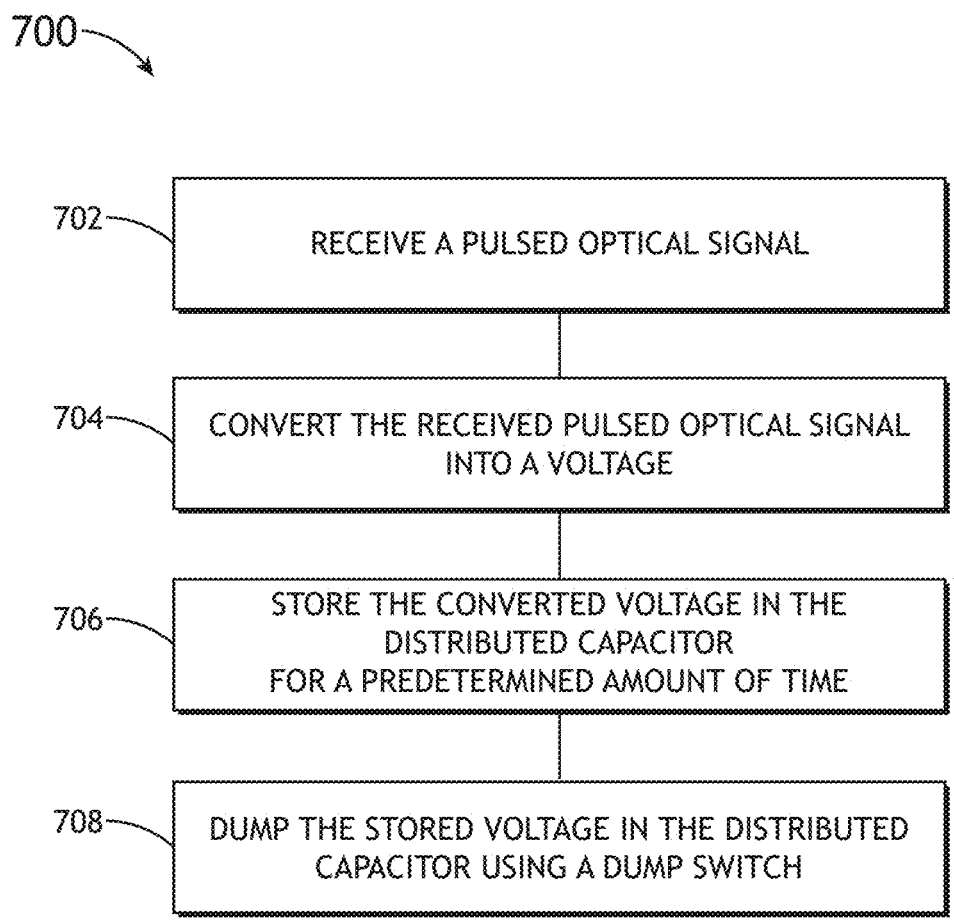
FIG. 7 illustrates a flow chart depicting a method or process for the analog pulse capture circuit, in accordance with one or more embodiments of the disclosure.

FIG. 7 illustrates a flow chart depicting a method or process 700 for the analog pulse capture circuit, in accordance with one or more embodiments of the disclosure.

In a step 702, a pulsed optical signal may be received.

In a step 704, the received pulsed optical signal may be converted to a voltage.

In a step 706, the converted voltage may be held by the one or more distributed capacitors for a predetermined time.

In a step 708, the stored voltage may be dumped. For example, the one or more dump switches may be configured to dump the charge stored in the one or more distributed capacitors before the next pulsed optical signal is received.

The one or more dump switches may be controlled via one or more control signals configured to cause the one or more dump switches to dump the charge (e.g., reset the one or more distributed capacitors). For example, in some embodiments, the one or more control signals are generated using a duty cycle digital clock (e.g., a 50% duty cycle digital clock).

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. An analog pulse capture circuit, the analog pulse capture circuit comprising:
   one or more input sources configured to receive one or more optical signals and generate one or more electrical input signals;
   one or more distributed capacitors configured to store a target charge, the one or more distributed capacitors including one or more coplanar waveguides, the one or more coplanar waveguides including one or more top plates and a plurality of bottom plates, at least one top plate of the one or more top plates is arranged coplanar with at least one bottom plate of the plurality of bottom plates, the one or more top plates referenced to a ground plane, the plurality of bottom plates referenced to the ground plane;
   one or more amplifiers coupled to the one or more distributed capacitors, the one or more amplifiers including at least one inverting terminal and at least one non-inverting terminal, the one or more amplifiers configured to generate one or more electrical output signals; and
   one or more dump switches coupled to the one or more input sources, the one or more dump switches configured to connect the one or more amplifiers to the one or more input sources, the one or more dump switches positioned proximate to the one or more distributed capacitors, the one or more dump switches configured to release the stored target charge of the one or more distributed capacitors.

2. The analog pulse capture circuit of claim 1, wherein the one or more distributed capacitors includes a first set of one or more distributed capacitors and an additional set of one or more distributed capacitors.

3. The analog pulse capture circuit of claim 2, wherein the one or more amplifiers includes one or more differential amplifiers coupled to the first set of one or more distributed capacitors and the additional set of one or more distributed capacitors.

4. The analog pulse capture circuit of claim 3, wherein the one or more top plates of the first set of one or more distributed capacitors are coupled to the at least one inverting terminal of the one or more differential amplifiers and the one or more top plates of the additional set of one or more distributed capacitors are coupled to the at least one non-inverting terminal of the one or more differential amplifiers.

5. The analog pulse capture circuit of claim 1, wherein the one or more input sources includes one or more photodiodes.

6. The analog pulse capture circuit of claim 1, wherein the plurality of top plates are coupled to the at least one inverting terminal.

7. An interleaving analog pulse capture circuit, comprising:
   one or more input sources configured to receive one or more optical signals and generate one or more electrical input signals;
   one or more sets of one or more distributed capacitors configured to store a target charge, each of the one or more distributed capacitors including one or more coplanar waveguides, the one or more coplanar waveguides including one or more top plates and a plurality of bottom plates, at least one top plate of the one or more top plates is arranged coplanar with at least one bottom plate of the plurality of bottom plates, the one or more top plates referenced to a ground plane, the plurality of bottom plates referenced to the ground plane;
   a plurality of amplifiers, each amplifier of the plurality of amplifiers coupled to the one or more distributed capacitors of the one or more sets of one or more distributed capacitors, each amplifier including at least one inverting terminal and at least one non-inverting terminal, each amplifier of the plurality of amplifiers configured to generate one or more electrical output signals;
   a plurality of dump switches coupled to the one or more input sources, the one or more switches configured to release the stored target charge of the one or more distributed capacitors; and
   a plurality of interleaving switches.

8. The interleaving analog pulse capture circuit of claim 7, wherein the one or more input sources includes one or more photodiodes.

9. The interleaving analog pulse capture circuit of claim 7, wherein the plurality of top plates are coupled to the at least one inverting terminal.

* * * * *